United States Patent

Schneider et al.

Patent Number: 5,339,035
Date of Patent: Aug. 16, 1994

[54] MR IMAGING WITH RECTANGULAR MAGNETIZATION TRANSFER PULSE

[75] Inventors: Erika Schneider, New Berlin; Matthew A. Bernstein, Waukesha, both of Wis.

[73] Assignee: General Electric Company, Milwaukee, Wis.

[21] Appl. No.: 57,940

[22] Filed: May 7, 1993

[51] Int. Cl.$^5$ ............................................. G01R 33/20
[52] U.S. Cl. ................................................. 324/309
[58] Field of Search ............... 324/300, 303, 307, 309, 324/310, 311, 312, 313, 318, 322; 128/653.2, 653.5

[56] References Cited

U.S. PATENT DOCUMENTS

| | | | |
|---|---|---|---|
| 4,318,043 | 3/1982 | Crooks et al. | 324/309 |
| 4,345,207 | 8/1982 | Bertrand et al. | 324/308 |
| 4,564,017 | 1/1986 | Glover | 128/653.2 |
| 4,567,893 | 2/1986 | Charles et al. | 128/653.2 |
| 4,694,254 | 9/1987 | Vatis et al. | 324/309 |
| 4,803,432 | 2/1989 | Perman | 324/309 |
| 4,855,679 | 8/1989 | Granot | 324/309 |
| 4,891,595 | 1/1990 | Granot | 324/309 |
| 4,933,638 | 6/1990 | Kleinberg et al. | 324/303 |
| 5,050,609 | 9/1991 | Balaban et al. | 128/653 |
| 5,167,232 | 12/1992 | Parker et al. | 324/309 |

OTHER PUBLICATIONS

*Pulsed Saturation Transfer Contrast*, Mag. Resonance in Medicine 26, 231–240 (1992) Bob S. Hu, et al. (no month).

*Improved Time-of-Flight MR Angiography of the Brain with Magnetization Transfer Contrast*[1], Radiology, vol. 184, No. 2, pp. 395–399 Aug. 1992.

*Magnetization Transfer of Hepatic Lesions: Evaluation of a Novel Contrast Technique in the Abdomen*[1], Radiology, vol. 182, No. 2, pp. 535–540 Feb. 1992.

Primary Examiner—Michael J. Tokar
Attorney, Agent, or Firm—Quarles & Brady

[57] ABSTRACT

An NMR scanner performs a series of pulse sequences from which NMR data is acquired and used to reconstruct an image. Image contrast is enhanced by magnetization transfer from short-$T_2$ spin species that are saturated by an off-resonance, substantially rectangular shaped RF saturation pulse applied during each pulse sequence.

5 Claims, 3 Drawing Sheets

MR IMAGING WITH RECTANGULAR MAGNETIZATION TRANSFER PULSE

BACKGROUND OF THE INVENTION

The field of the invention is nuclear magnetic resonance imaging methods and systems. More particularly, the invention relates to the acquisition of an NMR image in which contrast is affected by magnetization transfer.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the orthogonal, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped" into the x-y plane to produce a net transverse magnetic moment $M_t$, which is rotating, or spinning, in the x-y plane at the Larmor frequency.

The practical value of this phenomenon resides in the signal which is emitted by the excited spins after the excitation signal $B_1$ is terminated. In simple systems the excited spins induce an oscillating sine wave signal in a receiving coil. The frequency of this signal is the Larmor frequency, and its initial amplitude, $A_0$, is determined by the magnitude of the transverse magnetic moment $M_t$. The amplitude, A, of the emission signal decays in an exponential fashion with time, t:

$$A = A_0 e^{-t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field. The practical value of the $T_2$ constant is that spins associated with different tissue types have different $T_2$ values and this can be exploited as a means of enhancing the contrast between such tissues. Of particular relevance to the present invention, however, is the fact that many spins are tightly coupled to each other and have $T_2$ constants which are too short to acquire any useful signal from them with current NMR imaging pulse sequences. That is, these spins are excited and produce transverse magnetization, but they dephase quickly before the emission signal can be acquired.

Another important factor which contributes to the amplitude A of the NMR signal is referred to as the spin-lattice relaxation process which is characterized by the time constant $T_1$. It describes the recovery of the net magnetic moment M to its equilibrium value along the axis of magnetic polarization (z). The $T_1$ time constant is longer than $T_2$, much longer in most substances of medical interest. As with the $T_2$ constant, the difference in $T_1$ between tissues can be exploited to provide image contrast.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

Conventional MRI images rely primarily on the signals produced by hydrogen nuclei associated with water and fat molecules in the human body. While the resonance frequencies of these two spin species is different (i.e. 210 Hz at 1.5 T), they both produce significant signal when the RF excitation field is tuned to either one (for example, 63.86 MHz for water at 1.5 T). The contrast in the resulting images is primarily determined by the density of each of these spin species throughout the slice or volume of interest, although this contrast can also be influenced, or "weighted" by taking advantage of the different $T_1$ and $T_2$ constants of these two spin species in various tissues of the body. Thus, for example, a pulse sequence might be designed to emphasize the signal from water spins having a relatively long $T_1$ constant to enhance the contrast of tumor tissues in the image.

Image contrast can also be affected by selectively "saturating" certain spin species so that they are unable to emit any significant signal in the subsequently executed NMR pulse sequence. As described, for example, in co-pending U.S. patent application Ser. No. 07/902,634, such contrast preparation includes the application of an RF excitation pulse which may be specifically tuned to the resonance frequency of the spin species to be suppressed. The resulting transverse magnetization is dephased with spoiler gradients, and before the net magnet moment $M_z$ of the selected species can recover, the NMR pulse sequence is performed to acquire the desired signal. The spins which are saturated with the preparatory pulse contribute little to the acquired signal, thus affecting the image contrast of tissues containing such spins.

More recently, another mechanism has been discovered for modifying the contrast in MRI images. As described in U.S. Pat. No. 5,050,609, the contrast of MR images can be affected by selectively saturating spins which have a very short $T_2$ constant and do not themselves contribute to the acquired signal Instead, this pool of "bound", or "restricted", spins may transfer magnetization to associated "free" spins and affect the NMR signals which are acquired from these free spins as well as the $T_1$ and $T_2$ values of these free spins. The amount of such magnetization transfer varies between tissue types, with the result that it provides yet another mechanism for weighting image contrast.

There are a number of methods used to produce magnetization transfer weighted MRI images. The initial method applied a continuous RF excitation signal to the region of interest which was tuned to a frequency different than that of water or fat. This is illustrated in FIG. 3 where curve 10 indicates the net magnetization of various short-$T_2$ spin species having Larmor frequencies to either side of the "on resonance" frequency of the long-$T_2$ water/fat spins. Dotted line 11 illustrates the very narrow band of short-$T_2$ spins that are saturated with this method. While such "off resonance" continuous wave (CW) methods work, they present practical problems, such as the deposition of excessive RF power in human subjects and the need for separate RF amplifiers on commercially available MRI scanners. As a result, off resonance CW methods have not yet found widespread clinical use.

A number of pulsed magnetization transfer methods have also been proposed. Bob S. Hu et al. describe the application of a series of on resonance pulses which will saturate off resonance short $T_2$ spins "Pulsed Saturation Transfer Contrast" *Magn. Reson. Med.* August 1992, 26(2), 231–240. Such binomial trains of pulses at the Larmor resonance of the desired long-$T_2$ spin species (i.e. water/fat) will saturate spins outside a band of frequencies centered on resonance. Such a saturation curve for a $90_x - 90_x - 90_x + 90_x$ ($1\bar{1}\bar{1}1$) binomial pulse sequence is shown by dashed line 12 in FIG. 3. It can be seen that a significant spectrum of short-$T_2$ spins can be saturated with this method, thus making it more efficient than the CW method and enabling the RF power deposition in the patient to be lowered to acceptable levels. Practical considerations, however, also limit the applicability of this method. More specifically, curve 12 is the saturation that occurs in an ideal NMR scanner system with perfectly homogeneous magnetic fields. In practice, the inhomogeneities of the magnetic fields distort this saturation curve 12 such that long-$T_2$ spins at and near resonance are also affected directly. In other words, the clean band of unsaturated spins around resonance is not achievable in practical NMR systems and the signals produced by spins associated with water and fat are reduced directly by such on resonance magnetization transfer pulses.

Yet another approach is to employ off resonance pulses which are shaped to avoid saturating spins near resonance. One such method described by Robert R. Edelman et al., "Improved Time-Of-Flight Angiography Of The Brain With Magnetization Transfer Contrast" *Radiology* August 1992, 184(2), 395–399, employs a pulse of RF at a frequency that is off resonance and has a Gaussian envelope. This produces the saturation curve 13 in FIG. 3. This method is robust in that it works well despite field inhomogeneities, but to achieve the ideal levels of saturation, the Gaussian pulse must be applied for 14 to 20 milliseconds. This long interval significantly increases the length of each pulse sequence and the length of the entire scan. A similar approach is proposed by Eric Outwater et al., "Magnetization Transfer Of Hepatic Lesion: Evaluation of a Novel Contrast Technique In The Abdomen" *Radiology* February 1992, 192(2) 535–540, where the off resonance RF pulse has a sinc (i.e. sin(x)/x) envelope. As with the Gaussian off resonance RF pulse, the sinc RF pulse must ideally be applied for 14 to 20 milliseconds to achieve the degree of short-$T_2$ saturation needed for magnetization transfer contrast.

SUMMARY OF THE INVENTION

The present invention is an improved method for achieving magnetization transfer contrast in NMR images produced with NMR pulse sequences. More particularly, an off resonance RF excitation pulse having a substantially rectangular envelope is applied to the region of interest being imaged to saturate short-$T_2$ spins and enable them to transfer magnetization to long-$T_2$ spins in the region of interest before NMR signals are acquired from the long-$T_2$ spins. The sharp corners of the rectangular envelope may be rounded to reduce the excitation of on resonance long-$T_2$ spins, and the RF excitation pulse may be followed by the application of a magnetic field gradient pulse which dephases any transverse magnetization that might result.

A general object of the invention is to produce sufficient saturation of short-$T_2$ spin species to provide the desired level of magnetization transfer contrast without significantly increasing the scan time. By using the more efficient rectangular shaped RF pulse envelope, the necessary saturation can be achieved with pulses as short as 5 milliseconds. This means that magnetization transfer contrast can be added to nearly any NMR pulse sequence without a significant increase in total scan time.

Yet another object of the invention is to minimize the impact on net magnetization of long-$T_2$ spins at resonance while maximizing the impact on net magnetization of short-$T_2$ spins. This is accomplished by setting the frequency of the RF pulse off resonance and by rounding the sharp corners of the pulse to minimize excitation at resonance.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
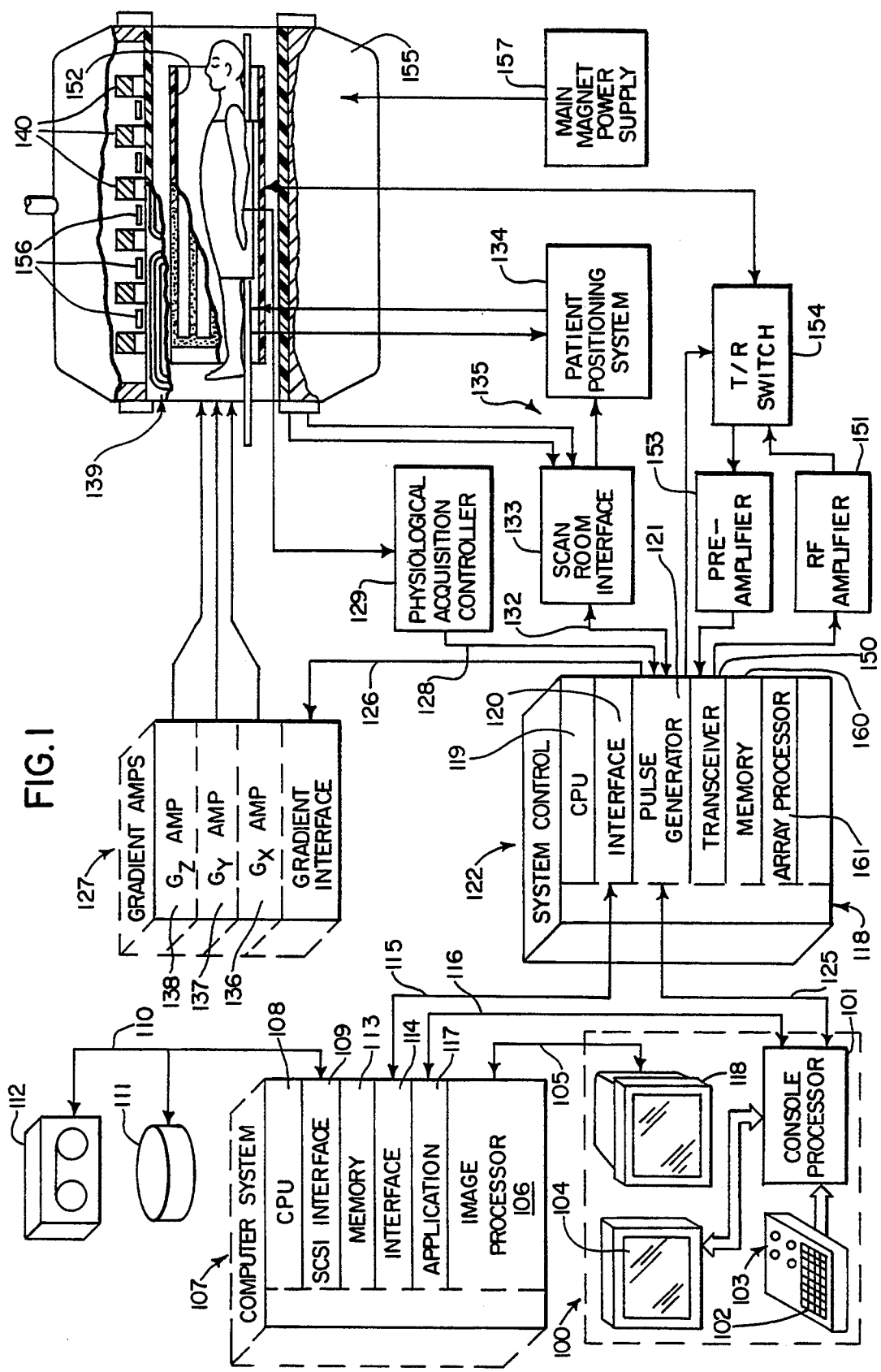
FIG. 1 is a block diagram of an NMR system which employs the present invention.

Referring first to FIG. 1, there is shown the major components of a preferred NMR system which incorporates the present invention and which is sold by the General Electric Company under the trademark "SIGNA". The operation of the system is controlled from an operator console 100 which includes a console processor 101 that scans a keyboard 102 and receives inputs from a human operator through a control panel 103 and a plasma display/touch screen 104. The console processor 101 communicates through a communications link 116 with an applications interface module 117 in a separate computer system 107. Through the keyboard 102 and controls 103, an operator controls the production and display of images by an image processor 106 in the computer system 107, which connects directly to a video display 118 on the console 100 through a video cable 105.

The computer system 107 is formed about a backplane bus which conforms with the VME standards, and it includes a number of modules which communicate with each other through this backplane. In addition to the application interface 117 and the image processor 106, these include a CPU module 108 that controls the VME backplane, and an SCSI interface module 109 that connects the computer system 107 through a bus 110 to a set of peripheral devices, including disk storage 111 and tape drive 112. The computer system 107 also includes a memory module 113, known in the art as a frame buffer for storing image data arrays, and a serial interface module 114 that links the computer system 107 through a high speed serial link 115 to a system interface module 120 located in a separate system control cabinet 122.

The system control 122 includes a series of modules which are connected together by a common backplane 118. The backplane 118 is comprised of a number of bus structures, including a bus structure which is controlled by a CPU module 119. The serial interface module 120 connects this backplane 118 to the high speed serial link 115, and pulse generator module 121 connects the backplane 118 to the operator console 100 through a serial link 125. It is through this link 125 that the system control 122 receives commands from the operator which indicate the scan sequence that is to be performed.

The pulse generator module 121 operates the system components to carry out the desired scan sequence. It produces data which indicates the timing, strength and shape of the RF pulses which are to be produced, and the timing of and length of the data acquisition window. The pulse generator module 121 also connects through serial link 126 to a set of gradient amplifiers 127, and it conveys data thereto which indicates the timing and shape of the gradient pulses that are to be produced during the scan. The pulse generator module 121 also receives patient data through a serial link 128 from a physiological acquisition controller 129. The physiological acquisition control 129 can receive a signal from a number of different sensors connected to the patient. For example, it may receive ECG signals from electrodes or respiratory signals from a bellows and produce pulses for the pulse generator module 121 that synchronizes the scan with the patient's cardiac cycle or respiratory cycle. And finally, the pulse generator module 121 connects through a serial link 132 to scan room interface circuit 133 which receives signals at inputs 135 from various sensors associated with the position and condition of the patient and the magnet system. It is also through the scan room interface circuit 133 that a patient positioning system 134 receives commands which move the patient cradle and transport the patient to the desired position for the scan.

The gradient waveforms produced by the pulse generator module 121 are applied to a gradient amplifier system 127 comprised of $G_x$, $G_y$ and $G_z$ amplifiers 136, 137 and 138, respectively. Each amplifier 136, 137 and 138 is utilized to excite a corresponding gradient coil in an assembly generally designated 139. The gradient coil assembly 139 forms part of a magnet assembly 141 which includes a polarizing magnet 140 that produces a polarizing field of either 0.5, or 1.5 Tesla (or some other strength) that extends horizontally through a bore 142. The gradient coils 139 encircle the bore 142, and when energized, they generate magnetic fields in the same direction as the main polarizing magnetic field, but with gradients $G_x$, $G_y$ and $G_z$ directed in the orthogonal x-, y- and z-axis directions of a Cartesian coordinate system. That is, if the magnetic field generated by the main magnet 140 is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x,y,z) in the bore of the magnet assembly 141 is given by $B(x,y,z) = B_0 + G_x x + G_y y G_z z$. The gradient magnetic fields are utilized to encode spatial information into the NMR signals emanating from the patient being scanned.

Located within the bore 142 is a circular cylindrical whole-body RF coil 152. This coil 152 produces a circularly polarized RF field in response to RF pulses provided by a transceiver module 150 in the system control cabinet 122. These pulses are amplified by an RF amplifier 151 and coupled to the RF coil 152 by a transmit/receive switch 154 which forms an integral part of the RF coil assembly. Waveforms and control signals are provided by the pulse generator module 121 and utilized by the transceiver module 150 for RF carrier modulation and mode control. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

In addition to supporting the polarizing magnet 140 and the gradient coils 139 and RF coil 152, the main magnet assembly 141 also supports a set of shim coil 156 associated with the main magnet 140 and used to correct inhomogeneities in the polarizing magnet field. The main power supply 157 is utilized to bring the polarizing field produced by the superconductive main magnet 140 to the proper operating strength and is then removed.

The NMR signals picked up by the RF coil 152 are digitized by the transceiver module 150 and transferred to a memory module 160 which is also part of the system control 122. When the scan is completed and an entire array of data has been acquired in the memory modules 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the video display 118.

Figure 2:
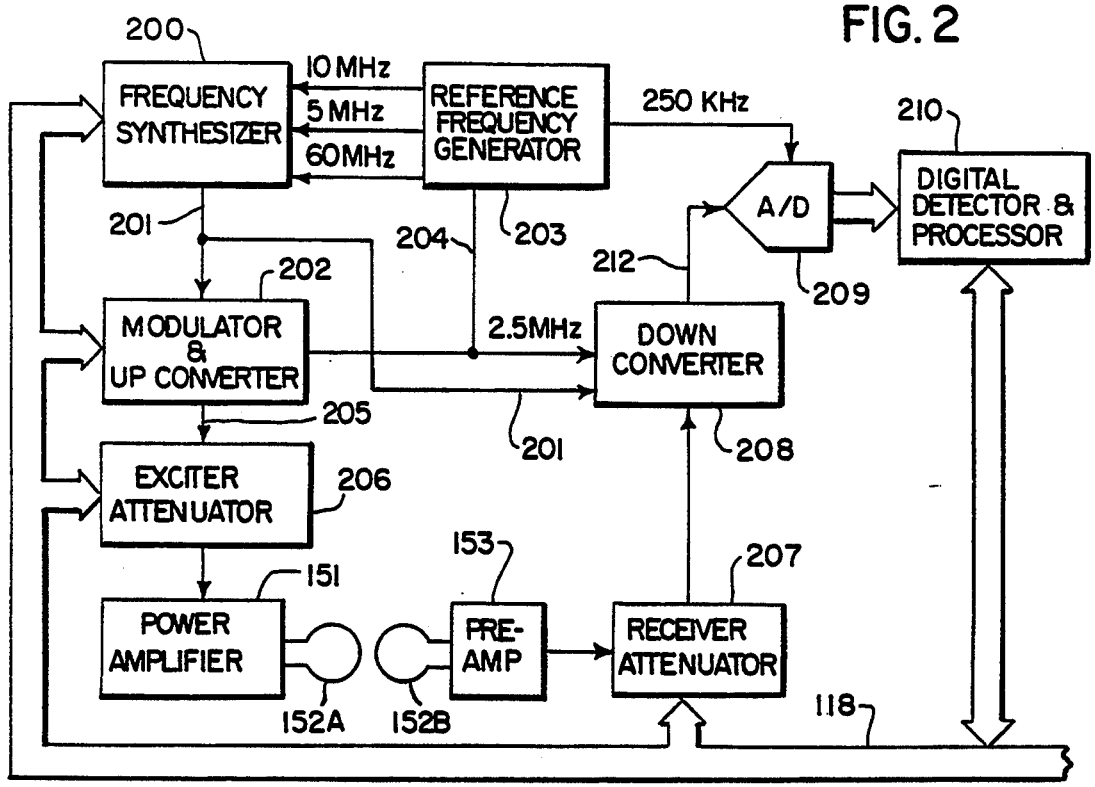
FIG. 2 is an electrical block diagram of the transceiver which forms part of the NMR system of FIG. 1.

Referring particularly to FIGS. 1 and 2, the transceiver 150 includes components which produce the RF excitation field $B_1$ through power amplifier 151 at a coil 152A and components which receive the resulting NMR signal induced in a coil 152B. As indicated above, the coils 152A and B may be separate as shown in FIG. 2, or they may be a single whole-body coil as shown in FIG. 1. The base, or carrier, frequency of the RF excitation field is produced under control of a frequency synthesizer 200 which receives a set of digital signals (CF) through the backplane 118 from the CPU module 119 and pulse generator module 121. These digital signals indicate the frequency and phase of the RF carrier signal which is produced at an output 201. The commanded RF carrier is applied to a modulator and up converter 202 where its amplitude is modulated in response to a signal R(t) also received through the backplane 118 from the pulse generator module 121. The signal R(t) defines the envelope, and therefore the bandwidth, of the RF excitation pulse to be produced. It is produced in the module 121 by sequentially reading out a series of stored digital values that represent the desired envelope. These stored digital values may, in turn, be changed from the operator console 100 to enable any desired RF pulse envelope to be produced. The modulator and up converter 202 produces an RF pulse at the desired Larmor frequency at an output 205.

The magnitude of the RF excitation pulse output through line 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIG. 1 and 2 the NMR signal produced by the subject is picked up by the receiver coil 152B and applied through the preamplifier 153 to the input of a receiver attenuator 207. The receiver attenuator 207 further amplifies the NMR signal and this is attenuated by an amount determined by a digital attenuation signal (RA) received from the backplane 118. The receive attenuator 207 is also turned on and off by a signal from the pulse generator module 121 such that it is not overloaded during RF excitation.

The received NMR signal is at or around the Larmor frequency, which in the preferred embodiment is around 63.86 MHz for 1.5 Tesla and 21.28 MHz for 0.5 Tesla. This high frequency signal is down converted in a two step process by a down converter 208 which first mixes the NMR signal with the carrier signal on line 201 and then mixes the resulting difference signal with the 2.5 MHz reference signal on line 204. The resulting down converted NMR signal on line 212 has a maximum bandwidth of 125 kHz and it is centered at a frequency of 187.5 kHz. The down converted NMR signal is applied to the input of an analog-to-digital (A/D) converter 209 which samples and digitizes the analog signal at a rate of 250 kHz. The output of the A/D converter 209 is applied to a digital detector and signal processor 210 which produce 16-bit in-phase (I) values and 16-bit quadrature (Q) values corresponding to the received digital signal. The resulting stream of digitized I and Q values of the received NMR signal is output through backplane 118 to the memory module 160 where they are employed to reconstruct an image.

To preserve the phase information contained in the received NMR signal, both the modulator and up converter 202 in the exciter section and the down converter 208 in the receiver section are operated with common signals. More particularly, the carrier signal at the output 201 of the frequency synthesizer 200 and the 2.5 MHz reference signal at the output 204 of the reference frequency generator 203 are employed in both frequency conversion processes. Phase consistency is thus maintained and phase changes in the detected NMR signal accurately indicate phase changes produced by the excited spins. The 2.5 MHz reference signal as well as 5, 10 and 60 MHz reference signals are produced by the reference frequency generator 203 from a common 20 MHz master clock signal. The latter three reference signals are employed by the frequency synthesizer 200 to produce the carrier signal on output 201. For a more detailed description of the receiver, reference is made to U.S. Pat. No. 4,992,736 which is incorporated herein by reference.

Figure 4:
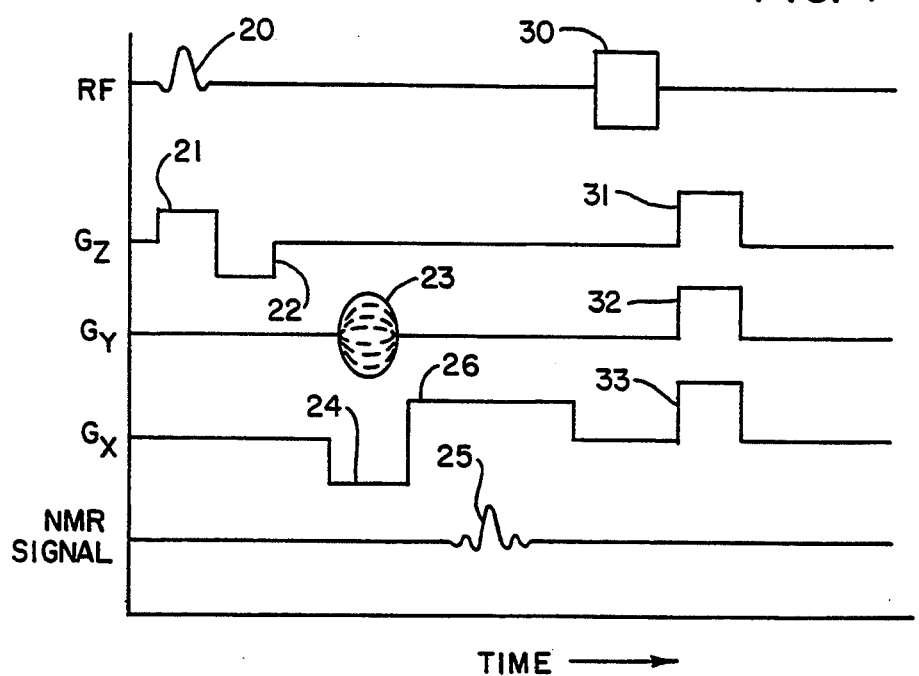
FIG. 4 is a graphic representation of a pulse sequence performed by the NMR system of FIG. 1 to implement the preferred embodiment of the invention.
Figure 3:
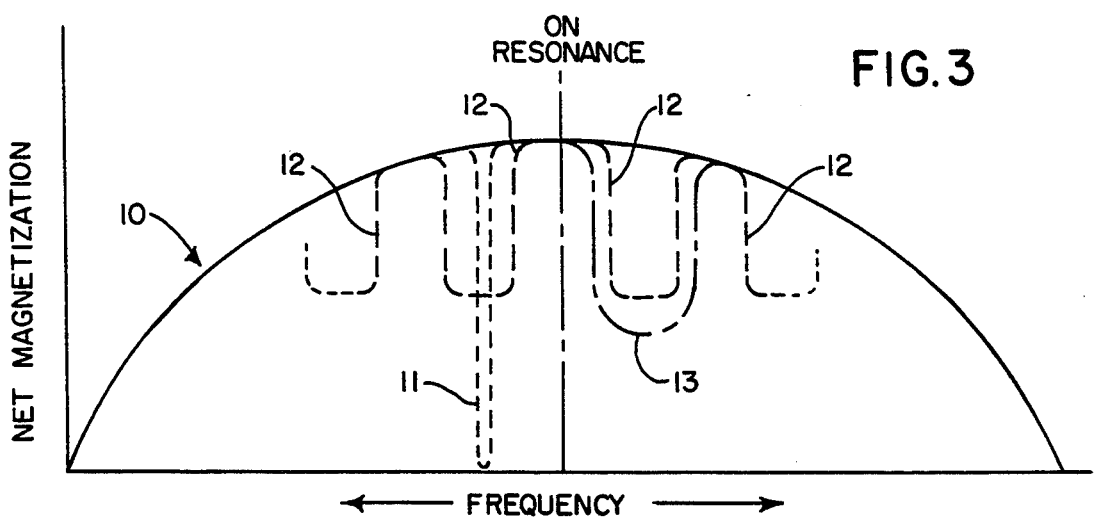
FIG. 3 is a graphic representation of the saturation curves for various prior art methods of implementing magnetization transfer.

Referring particularly to FIG. 4, an NMR pulse sequence which is executable by the NMR system of FIG. 1 to practice the preferred embodiment of the invention begins with a slice selective RF excitation pulse 20 produced in the presence of a $G_z$ slice select gradient field pulse 21. The RF excitation pulse has a frequency of the Larmor resonant frequency for water spins. This pulse 20 is amplitude modulated with an envelope waveform R(t) to excite spins in a slice through the subject as is well known in the art. A $G_z$ rephasing lobe 22 follows and a phase encoding $G_y$ gradient pulse 23 is then applied to encode the signals for position along the y axis. A $G_x$ pulse is applied at 24 to induce a gradient recalled echo signal 25 that is acquired in the presence of a $G_x$ readout gradient 26.

As is well known in the art, this pulse sequence is repeated and the value of the $G_y$ phase encoding pulse 23 is stepped through a set of values (for example, 128 or 256) to acquire a corresponding number of NMR echo signals 25. An image is reconstructed by performing a two-dimensional Fourier transformation on this acquired data set as indicated above.

Referring still to FIG. 4, the NMR pulse sequence is modified according to the present invention by producing an off-resonance RF saturation pulse 30. In the preferred embodiment this is accomplished by switching the carrier frequency to a value which is off resonance by 1.2 kHz. This off-resonance carrier is modulated by a substantially rectangular envelope waveform R(t) as will be described in more detail below. The off-resonance RF pulse 30 is applied from 5 to 10 milliseconds depending on the degree of magnetization transfer contrast desired with a resulting flip angle of 500° to 2000°.

After the application of the off-resonance RF saturation pulse 30, dephasing gradient pulses 31–33 are applied along the respective z, y and x axes. These gradient pulses 31–33 quickly dephase, or "spoil" any transverse magnetization that is produced in the long-$T_2$ spin species by the RF pulse 30, so that such magnetization will not contribute significantly to the NMR echo signal 25 acquired during the following pulse sequence. Before the next pulse sequence is started, the RF carrier frequency is also switched back to resonance.

In the preferred embodiment of FIG. 4, the RF saturation pulse 30 follows the NMR signal acquisition 25, and as a result, one or more equilibration pulse sequences are performed at the beginning of the scan to properly prepare the magnetization. Such equilibration sequences are the same as that shown in FIG. 4, but no NMR signal is acquired. In the alternative, the RF saturation pulse 30 and spoiler pulses 31–33 may be placed at the beginning of each pulse sequence rather than the end. The results are virtually equivalent.

Figure 5:
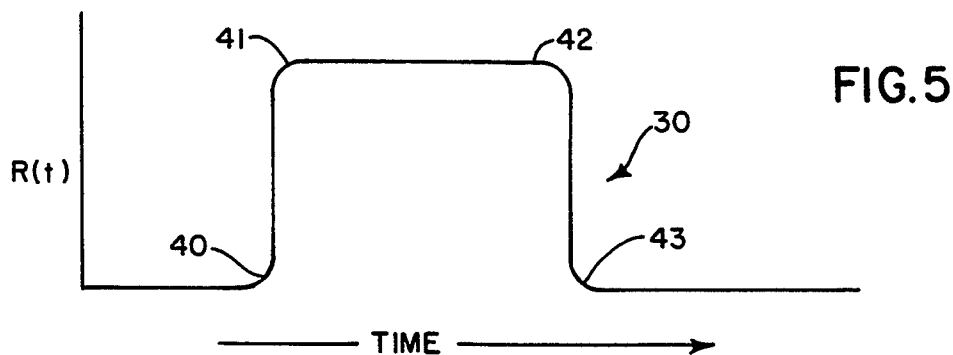
FIG. 5 is a graphic representation of the RF saturation pulse which is employed in the pulse sequence of FIG. 4.

Referring to FIG. 5, the shape of the RF saturation pulse 30 is substantially rectangular, with the sharp corners at 40–43 having been rounded off as shown. It has been discovered that such rounding off of the rectangular waveform does not significantly reduce the efficiency at which RF power is delivered to off-resonance short-$T_2$ spins, but it does significantly reduce the excitation of on-resonance, long-$T_2$ spin species. This rounding off can be accomplished by applying a Fermi filter to the rectangular waveform of pulse width PW. The time domain Fermi filter is as follows for time t during the production of the rectangular RF waveform of width PW:

$$F(t) = 1/(1 + e^{|t-t_0|/T}), \frac{-PW}{2} \leq t \leq \frac{PW}{2}$$

where:
T = a value which determines the degree of "rounding-off" = 0.05*(PW/2) in the preferred embodiment; and
$t_0$ = time at which rounding off begins = 0.7*(PW/2) in the preferred embodiment.

If we define a dimensionless RF saturation pulse efficiency factor (E) for a pulse of width (PW) and amplitude (A) as follows:

$$E = \frac{1}{A \times PW} \int_{-PW/2}^{PW/2} F(t)dt;$$

then the preferred embodiment of the substantially rectangular RF saturation pulse has an efficiency E=0.70. This is in contrast to prior methods which employ saturation pulses of considerably lower efficiencies.

The degree of rounding-off (T) applied by this filter is determined by appropriately trading off RF saturation pulse efficiency against reduced excitation of on resonance spins. The degree of rounding and the width of the "rectangular" portion of the RF saturation pulse determine the spectral width as well as the extent and number of oscillations in the saturation pattern (FIG. 6) for both long and short-$T_2$ spins. Increased rounding produces spectral response with decreased oscillation bandwidth of the saturation pulse. By increasing the rounding, the saturation pulse can be played closer to resonance without directly saturating on-resonance long-$T_2$ spins. Transmission closer to resonance frequency also improves the utilization of RF power required for saturation. Use of increased rounding for improved RF utilization causes, however, a decrease in overall effective pulse area which decreases the degree of magnetization transfer and the image contrast produced thereby.

Figure 6:
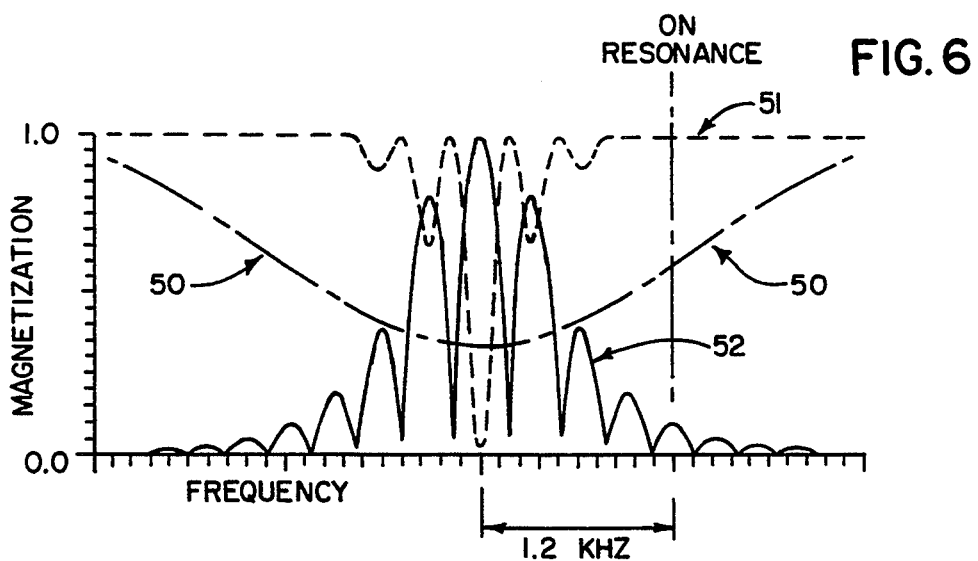
FIG. 6 is a graphic representation of the effect the RF saturation pulse of FIG. 5 has on the magnetization of spins.

Referring to FIG. 6, the effect of the rectangular RF saturation pulse 30 on spin magnetization differs considerably for long-$T_2$ and short-$T_2$ spin species. Curve 50 is the net magnetization $M_z$ of short-$T_2$ spin species. It is this saturation which drives the magnetization transfer contrast mechanism, and it can be seen that the rectangular saturation pulse 30 significantly saturates a broad range of spin frequencies. The degree of magnetization transfer contrast is determined primarily by the total area of the rectangular saturation pulse waveform 30.

In contrast, if long-$T_2$ spins resonate 1.2 kHz away from the water resonance frequency, the effect of the rectangular RF saturation pulse 30 on their net magnetization $M_z$ is indicated by curve 51. As expected, at the off resonance frequency of the pulse 30 the hypothetical long-$T_2$ spins would be totally saturated. However, at and near resonance the net magnetization $M_z$ of the long-$T_2$ spins is virtually unaffected. As a result, the signal-to-noise ratio of the reconstructed image is not noticeably diminished by the RF saturation pulse 30. On the other hand, curve 52 shows the effect on transverse magnetization $M_t$ of the long-$T_2$ spins as a result of the rectangular RF saturation pulse 30. The shape of this $M_t$ waveform 52 is the Bloch equation transformation of the rectangular waveform 30 and it can be seen that the series of peaks in the $M_t$ waveform 52 extends to the water resonance frequency. In any event, the on-resonance, transverse magnetization $M_t$ that is produced is promptly dephased by the spoiler magnetic field gradient pulses 31–33 as explained above. Also, since the magnetization $M_t^2 + M_z^2$ is essentially constant (neglecting relaxation effects), the sideband ripples in magnetization $M_z$ do not substantially saturate the on-resonance long-$T_2$ magnetization, even though the sideband ripples in magnetization $M_t$ extend past 1.2 kHz (see 52 in FIG. 6).

Thus, by employing the present invention the short-$T_2$ spins that are unobservable by conventional MRI can be saturated quickly by the off-resonance rectangular pulse 30 to yield magnetization transfer contrast. This is accomplished without directly saturating the long-$T_2$ spins which are not effected by the magnetization transfer process. It should be apparent to those skilled in the art that this invention may be applied to a wide variety of imaging and spectroscopy pulse sequences where magnetization transfer is desired.

We claim:

1. A method of enhancing the contrast of an image produced from NMR data acquired during a scan in which a series of pulse sequences are executed to elicit NMR signals from long-$T_2$ spins in a subject at a selected Larmor resonant frequency, which comprises:
applying a substantially rectangular shaped RF saturation pulse to the subject prior to the acquisition of said NMR data to substantially reduce the net magnetization of short-$T_2$ spins in the subject, the frequency of said substantially rectangular shaped RF saturation pulse being offset from said selected Larmor resonant frequency by an amount which prevents the substantially rectangular shaped RF saturation pulse from reducing the net magnetization of long-$T_2$ spins at said selected Larmor resonant frequency.

2. The method as recited in claim 1 in which one of said substantially rectangular shaped RF saturation pulses is applied during each of said pulse sequences in the series.

3. The method as recited in claim 1 which includes:
applying a magnetic field gradient pulse to the subject following the application of the substantially rectangular shaped RF saturation pulse to dephase transverse magnetization of the long-$T_2$ spins.

4. The method as recited in claim 1 in which the substantially rectangular shaped RF saturation pulse is produced by filtering a rectangular shaped RF saturation pulse.

5. The method as recited in claim 4 in which the filtering is performed using a Fermi filter.

* * * * *